United States Patent [19]

Nakatani et al.

[11] Patent Number: 4,920,917
[45] Date of Patent: May 1, 1990

[54] REACTOR FOR DEPOSITING A LAYER ON A MOVING SUBSTRATE

[75] Inventors: Kenji Nakatani, Hino; Hiroshi Okaniwa, Hachioji; Mitsuaki Yano, Osaka, all of Japan

[73] Assignee: Teijin Limited, Osaka, Japan

[21] Appl. No.: 166,689

[22] Filed: Mar. 11, 1988

[30] Foreign Application Priority Data

Mar. 18, 1987 [JP] Japan .................................. 62-61193
Mar. 31, 1987 [JP] Japan .................................. 62-76384

[51] Int. Cl.$^5$ ............................................. C23C 16/50
[52] U.S. Cl. ...................................... 118/718; 118/719; 118/723
[58] Field of Search ........................ 118/718, 719, 723

[56] References Cited

U.S. PATENT DOCUMENTS 4,438,723  3/1984  Cannella et al.
4,450,787  5/1984  Weakliem ............................ 427/39

FOREIGN PATENT DOCUMENTS 55-125681  9/1980  Japan.

OTHER PUBLICATIONS

Technical Digest P-I-16 1st Photovoltaic Science and Engineering Conference Nov. 13–16/1984 pp. 187–190.

Primary Examiner—Richard Bueker
Attorney, Agent, or Firm—Kenyon & Kenyon

[57] ABSTRACT

A solar cell having a layered structure with improved characteristics can be manufactured in plasma assisted CVD at a high rate deposition. In one aspect, separators are arranged between discharge electrodes to control a distribution of the composition of a reaction gas in a reaction chamber, giving a desired composition profile of a layer in the direction of the layer thickness. In another aspect, a grid electrode is inserted between a substrate and one of discharge electrodes only near an entrance portion thereof so that a high power can be applied to discharge electrodes to increase a deposition rate without plasma damage to an interface between a layer to be deposited and an underlying substrate. In a further aspect, an electric-field-adjusting means such as a metal wire is provided with an opening of a mask arranged between a substrate and one of the discharge electrodes for controlling the quality and layer thickness of a layer to be deposited. This electric-field adjusting means makes the electric field distribution uniform in the mask opening, thereby preventing a nonuniformity of the characteristics of a deposited layer.

31 Claims, 9 Drawing Sheets

REACTOR FOR DEPOSITING A LAYER ON A MOVING SUBSTRATE

BACKGROUND OF THE INVENTION

1. Field of the Invention

The present invention relates to a reactor for manufacturing a semiconductor device, and particularly, to a reactor for depositing a layer on a moving substrate by plasma assisted chemical vapor deposition (PACVD), which is especially suitable for manufacturing a solar cell.

2. Description of the Related Art

The processes for manufacturing a semiconductor device by depositing a single or a plurality of thin semiconductor layers onto a substrate in a plasma atmosphere by chemical vapor deposition (CVD) are well known; for example, a process for manufacturing an amorphous silicon solar cell by a glow discharge decomposition of silane ($SiH_4$) gas. Note, a typical amorphous silicon solar cell has a substrate/n-type microcrystalline silicon/i-type amorphous silicon/p-type microcrystalline silicon structure. Among the known processes, a process in which a substrate is continuously moved in a CVD plasma discharge atmosphere is considered suitable for the efficient manufacture of a thin semiconductor layer on a large scale.

This process can be carried out by the following two methods: The first is the load lock method in which a single, or if necessary a plurality of, completely isolated reaction chamber(s) for plasma discharge is (are) arranged between a loading chamber and a take-up chamber, and substrates are carried on a carriage and transferred through each chamber, including the reaction chamber, and a layer is deposited onto the substrates during the stay in the reaction chamber(s). The second is the roll-to-roll method in which a substrate is supplied as a form of a rolled-up strip which is transferred from a supply roll chamber to a take-up-roll chamber, between which a single, or if necessary a plurality of, reaction chamber(s) for plasma discharge is (are) arranged and a layer is deposited onto the substrate while it is continuously moved through the reaction chamber(s).

In an advantageous process, a p-i-n structure of a solar cell is manufactured in successively connected reaction chambers through which a substrate, preferably a rolled-up strip, is continuously moved, and in which p-type, i-type, and n-type layers are successively deposited.

In a process for depositing semiconductor layers onto a substrate by plasma discharge CVD (plasma assisted CVD), if a plurality of layers having different compositions or levels of doping impurity are to be formed, the reaction gas is changed for each layer in a reaction chamber, or a plurality of reaction chambers, in which different reaction gases are used, and a substrate is transferred successively through the reaction chambers. This is because a single reaction chamber involves an almost uniform composition of plasma gas and does not allow an appropriate spacial distribution of the composition of the plasma gas. Therefore, if a desired spacial distribution of the composition of the plasma gas could be formed in a single reaction chamber, a plurality of layers having different composition or levels of doping impurity could be formed only by moving a substrate through a plasma gas having such a desired spacial distribution of the compositions in a single reaction chamber, thus allowing the process and apparatus of manufacturing the plurality of layers to be simplified.

A disadvantage when a plurality of layers having different compositions or doping levels are to be formed consecutively on a substrate, is that plurality of reaction chambers becomes necessary because a reaction gas having a each required composition must be fed into each of the reaction chambers.

When a plurality of reaction chambers are used in the roll-to-roll method, the respective reaction chambers are not completely separated and independent, but are interconnected by a passage along which the substrate is moved, and as a result, it is inevitable that the reaction gases in neighbor reaction chambers will be intermixed by movement of a substrate through the passage connecting the reaction chambers. As the above intermixing of reaction gases causes a deterioration of the characteristics of a device which comprises a plurality of layers having different compositions, proposals have been made to form a predetermined directional gas flow along the substrate passage connecting the reaction chambers (see Japanese Unexamined Patent Publication (Kokai) No. 58-216475); to provide a buffer chamber between the reaction chambers, by which each reaction gas in the reaction chambers is isolated to a predetermined level by evacuation (see Japanese Unexamined Patent Publication (Kokai) No. 59-34668); and to provide a slot interconnecting the reaction chambers and establish a gas flow from the slot into a reaction chamber at a rate sufficient to maintain a ratio of $10^4$ of concentration between the reaction chambers (U.S. Pat. No. 4,438,723). However, in these methods, once a reaction gas penetrates a neighboring reaction chamber having a different reaction gas composition beyond the isolation means (the buffer chamber), the penetrated reaction gas diffuses throughout the entire neighbouring reaction chamber and becomes uniformly distributed in that reaction chamber thus there is no way of controlling the distribution of the composition or the level of doping impurity in a direction of the layer thickness at the interface of successive deposited layers, for example, to obtain a graded junction or a stepped junction. It is known that a specific profile of a dopant level in an i-type silicon layer may improve the cell characteristics of an amorphous silicon solar cell having a p-i-n structure (For example, "Technical Digest, 1st International Photovoltaic Science and Engineering Conference Nov. 13-16/1984", P-I-16, pp. 187-190). Therefore, the capability to control the profile of a doping level in a deposited layer is obviously advantageous in the manufacture of an amorphous silicon solar cell.

One object of the present invention is to solve the above-mentioned problems of the prior art and to allow the control of a spacial distribution of a reaction gas in a single reaction chamber during plasma discharge CVD.

Another object of the present invention is to provide, for example, layers having a desired interface profile such as a graded or stepped junction.

In the manufacture of a solar cell on a large scale, the deposition rate should be increased. To accelerate the deposition rate, the glow discharge power is increased under the supply of sufficient reaction gas to increase the concentration of the active species. However, in that method, the increase of the glow discharge power causes an increase of the kinetic energies of the charged particles, causing so-called plasma damage, for example, damage to the surface of the substrate or the layer deposited on the substrate by bombardment of the charged particles, and as a result, deterioration of the characteristics of a device comprising a deposited layer. This disadvantage is particularly noticeable when an i-type semiconductor layer is formed on a p-type or n-type semiconductor layer in the manufacture of an amorphous silicon solar cell.

A further object of the present invention is to solve this problem of the prior art and to allow a fast deposition of a layer by plasma discharge CVD without plasma damage.

An arrangement of the thickness of a layer is necessary in the deposition of a layer on a moving substrate in plasma discharge CVD. To this purpose, a mask is sometimes provided to control the amount of plasma reaching the surface of a substrate so that the thickness of a deposited layer is arranged. A mask is also used for depositing a layer in a desired pattern. However, the inventors found that this arrangement of a mask causes variations in the quality of the deposited semiconductor layer, between the edge portion and the central portion of the opening of the mask. When a microcrystallized amorphous silicon layer was deposited in plasma discharge CVD with a mask, it was found that a portion of the deposited layer near the edge of the opening of the mask had been microcrystallized but the deposited layer near the center of the opening of the mask was amorphous and the conductivity of the deposited layer gradually decreased from the edge toward the center of the layer.

Therefore, an object of the present invention is to solve this problem and to allow a deposition of a uniform layer even when a mask is used to control the quality or thickness of a layer to be deposited.

SUMMARY OF THE INVENTION

In accordance with one aspect of the present invention, there is provided a reactor for depositing a layer on a moving-substrate, said reactor comprising: a reaction chamber having opposite ends; opposite electrodes for electric discharge arranged in the reaction chamber, the substrate being moved between the opposite electrodes from one end to the other end of the reaction chamber; a means for feeding a reaction gas to the reaction chamber; a means for separating at least the space between the moving substrate and one of the opposite electrodes into a plurality of regions and substantially preventing a diffusion of a gas between the separated regions; and a power source for supplying a power between the opposite electrodes to excite the reaction gas to a plasma state; whereby a layer having a modified depth composition profile is deposited on the substrate.

This aspect of the present invention was accomplished by finding that arranging of the separators perpendicularly between discharge electrodes for preventing an interdiffusion of gases in the separated regions does not disturb the glow discharge, thus allowing a stable deposition, and that by restriction of the passage of a reaction gas between the separated regions to a narrow area adjacent to the surface of a substrate, and by locating a gas inlet and a gas outlet in a direction of movement of the substrate, the distribution of the composition of the gas can be controlled in the direction of movement of the substrate.

The separating means used in the present invention is not particularly limited as long as it acts as a barrier to a gas, but is preferably made of a material which is not damaged by plasma, including, for example, stainless steel. The separator is generally electrically grounded together with the reaction chamber, but may be electrically floating or biased. The shape of the separator is not limited as long as it prevents a diffusion of a gas in a direction of movement of a substrate but is normally selected so that a complete barrier is provided for all cross-sections of the reaction chamber except for a gap between the separating means and the moving substrate. If a member is located in the reaction chamber, the separator may have a shape by which only a passage of a gas left by that member is blocked. Usually however, the gap must include a slit for diffusing a gas therethrough.

The number of separating plates and the distances therebetween depend on a desired profile in the direction of a layer thickness, of the composition of a layer to be deposited and is determined by experiment.

The locations of the gas inlet and outlet ports are also determined experimentally, depending on a desired profile, in the direction of a layer thickness, of the composition of a layer to be deposited. For example, if two layers having different compositions are desired, gas inlet ports for the respective reaction gases may be located at both ends of the reaction chamber in the direction of movement of a substrate, respectively, and a common evacuation port located therebetween. If a layer having a gradually changing composition profile is desired, the gas inlet ports for the respective reaction gases may be located at both ends of the reaction chamber in the direction of movement of a substrate, respectively, and a common evacuation port located at one of the ends of reaction chamber. In this case, one reaction gas may be a doping gas, so that a layer having a gradually changing concentration of a dopant in a direction of layer thickness can be obtained.

According to this aspect of the present invention, a remarkable simplification of a system for forming a plurality of layers using the roll-to-roll method may be advantageously attained. Also, it becomes advantageously possible to provide a reactor for forming a layer in which the composition profile is controlled.

In another aspect of the present invention, there is provided a reactor for depositing a layer on a moving substrate, said reactor comprising: a reaction chamber having opposite ends; opposite electrodes for electric discharge arranged in the reaction chamber, said substrate being moved between the opposite electrodes from one end to the other end of the reaction chamber; means for feeding a reaction gas into the reaction chamber; a power source for supplying a power between the opposite electrodes to excite the reaction gas to a plasma state, and a grid electrode disposed between one of the opposite electrodes and the moving substrate at a given length from an end of the opposite electrodes near said one end of the reaction chamber toward another end of the opposite electrodes near said other end of the reaction chamber, said grid electrode having a width larger than the width of the moving substrate; whereby damage to the interface of the substrate and the deposited layer by plasma bombardment is prevented.

This aspect of the present invention is based on the following findings. If the high discharge power is applied to prepare a layer at a high deposition rate, the energy conversion efficiency of the resultant solar cell is usually decreased. This is due to a deterioration of an i-type amorphous silicon layer caused by contamination of this layer by a material sputtered from the underlying layer at the beginning of the deposition of the i-type layer. This contamination is caused by plasma bombardment of the underlying layer at the beginning of the deposition of the i-type layer. After investigations into various methods of decreasing a plasma bombardment, it was found that arrangement of a grid electrode between discharge electrodes near the entrance thereof may decrease the plasma energy in the vicinity of the grid electrode and prevent the above-mentioned plasma damage while allowing a fast deposition at a portion other than in the vicinity of the grid electrode without being affected by the grid electrode.

This aspect of the present invention was accomplished in connection with the manufacture of an amorphous silicon solar cell, but it is clear that the present invention can be applied to other processes for depositing a layer on a substrate. That is, this aspect of the present invention is applicable to a thin film device having a layer on a substrate (the substrate may have another layer on the top thereof). It is the fact that a damage to an interface between the layer and the substrate markedly deteriorates the characteristics of the device while an exposure of the inner portion of the layer to such a high energy plasma has an effect of accelerating the decomposition of a reaction gas without affecting the characteristics of the device.

The grid electrode of the present invention is arranged at only a portion of the parallel electrodes for glow discharge near the entrance of a substrate. The length of the grid electrode should be determined by experiment because the role of grid electrode depends on the semiconductor layer desired and bias voltage to be applied to the grid electrode. However, in practice, the length of the grid electrode is appropriately selected to be within a half, for example, one third or less, of the entire length of the parallel electrodes for glow discharge for obtaining a desired rate of deposition of a semiconductor layer. The type of grid electrode is selected from those comprising perforated sheets having many pores throughout the entire sheet, including mesh or net and comb forms. The size of the pore is selected such that plasma can be enclosed,, but the passage of the activated species is maximized. The size of the pores can be practically selected to be within 50 mesh in the case of a mesh or net form sheet.

In accordance with a further aspect of the present invention, there is provided a reactor for depositing a layer on a moving substrate, the reactor comprising: a reaction chamber having opposite ends; opposite electrodes for electric discharge in the reaction chamber, the substrate being moved between the opposite electrodes from one end to the other end of the reaction chamber; means for feeding a reaction gas to the reaction chamber; a power source for supplying a power between the opposite electrodes to excite the reaction gas to a plasma state; a mask having an opening, disposed between one of the opposite electrodes and the moving substrate, to limit an area whereat the layer is deposited on the moved substrate, the mask being provided with a means for adjusting an electric field in the opening of the mask, whereby a layer having a modified distribution of the quality thereof is deposited on the substrate.

This aspect of the present invention was attained by the following. From an investigation of the reasons why the quality of the layer is nonuniform when a mask is used, it was found that the electric field is concentrated near the edge of the opening of the mask and a local discharge is generated between the substrate and the edge portion of the mask, resulting in a weakening of the discharge intensity near the center of the opening or the substrate.

Accordingly, the inventors experimented with various measures to level the distribution of the electric field in a portion of the mask opening, including: changing the shape of the edge of the mask opening, placing the mask as near as possible to the substrate, and suppressing the applied power, etc., not so as to disturb the profile of isoelectric plane. However, these measures were not satisfactory. Finally, an electric-field-adjusting means which levels an applied potential profile was provided at the center portion of the mask opening, so that the electric field distribution had a uniform profile in the mask opening, and the problem was solved.

The electric field adjusting means used in the present invention is not particularly limited as long as it makes the electric field profile uniform in the mask opening while maintaining the function of the mask opening, but wire members are preferable since they do not affect the layer thickness distribution etc. but allow an effective adjustification of the electric field. The wire member may be arranged in a simple central position in the opening, a parallel arrangement, a grid arrangement, with an appropriate space, etc., and preferably it is selected by experiment depending on the size and shape of the mask opening. The material of the electric-field-adjusting member is not limited as long as it can concentrate an electric field in plasma discharge and adjust an electric field in a mask opening, but electrically conductive materials which can be easily machined are preferable and metals with a low emission of a gas are more preferable, including stainless steel, tungsten, titanium, molybdenum, etc., which are metals resistant to plasma.

In the formation of a microcrystalline amorphous silicon layer, a power of at least 5 mW/cm$^2$ should be applied to the entire surface of a substrate to obtain good electrical and physical properties. To meet this requirement, the, electric-field-adjusting means preferably comprises a wire member (including a filament and yarn) having a diameter of 0.5 to 2 mm, more preferably 1 to 1.5 mm.

Moreover, the electric field intensity may be selectively controlled by varying a distance between the electric-field-adjusting means and the substrate.

The shape of the discharge electrodes to which a mask provided with the above electric-field-adjusting means can be applied, may be the parallel plane type, the parallel curved plane type including a can, and non-parallel electrodes. For non-parallel electrodes, the shape, location, material, etc., of an electric-field-adjusting means may be selected to make the electric field profile uniform.

In accordance with the foregoing description the present invention, provides a system for manufacturing a semiconductor device by depositing a first layer on a substrate in a first reactor, and depositing a second layer on the first layer on the substrate in a second reactor, and then depositing a third layer on the second layer above the substrate in a third reactor, the substrate being transferred from the first to the second to the third reactors, (A) said first reactor comprising:
  (i) a first reaction chamber having first and second ends;

(ii) first and second electrodes for electrical discharge arranged in the first reaction chamber, the substrate being moved between the first and second electrodes from the first to second ends of the first reaction chamber;

(iii) a first mask means having an opening, disposed between the second electrode and the moving substrate, for limiting an area whereat the first layer is deposited on the moving substrate;

(iv) first means for feeding a first reaction gas into the first reaction chamber; and (v) a first power source for supplying a power between the first and second electrodes to excite the first reaction gas to a plasma state;

(B) said second reactor comprising:

(i) a second reaction chamber having third and fourth ends, the third end of the second reaction chamber being connected with the second end of the first reaction chamber;

(ii) third and fourth electrodes for electric discharge arranged in the second reaction chamber, the substrate having the first layer thereon being moved between the third and fourth electrodes from the third to fourth ends of the second reaction chamber;

(iii) means for feeding a second reaction gas into the second reaction chamber;

(iv) means for separating at least the space between the moved substrate and the fourth electrode into a plurality of regions and substantially preventing a diffusion of a gas between the separated regions; and (v) a second power source for supplying a power between the third and fourth electrodes to excite the second reaction gas to a plasma state; and (C) a third reactor comprising:

(i) a third reaction chamber having fifth and sixth end, the fifth end of the third reaction chamber being connected to the fourth end of the second reaction chamber;

(ii) fifth and sixth electrodes for electric discharge arranged in the third reaction chamber, the substrate having the first and second layers thereon being moved between the fifth and sixth electrodes from the fifth to sixth ends of the third reaction chamber;

(iii) a second mask means having an opening, disposed between the sixth electrode and the moving substrate, for limiting an area whereat the third layer is deposited on the moving substrate, at least one of said first and second mask means being provided with means for adjusting an electric field in the opening of the mask;

(iv) third means for feeding a third reaction gas into the third reaction chamber; and (v) a third power source for supplying a power between the fifth and sixth electrodes to excite the third reaction gas to a plasma state.

DESCRIPTION OF THE PREFERRED EMBODIMENTS

Figure 1:
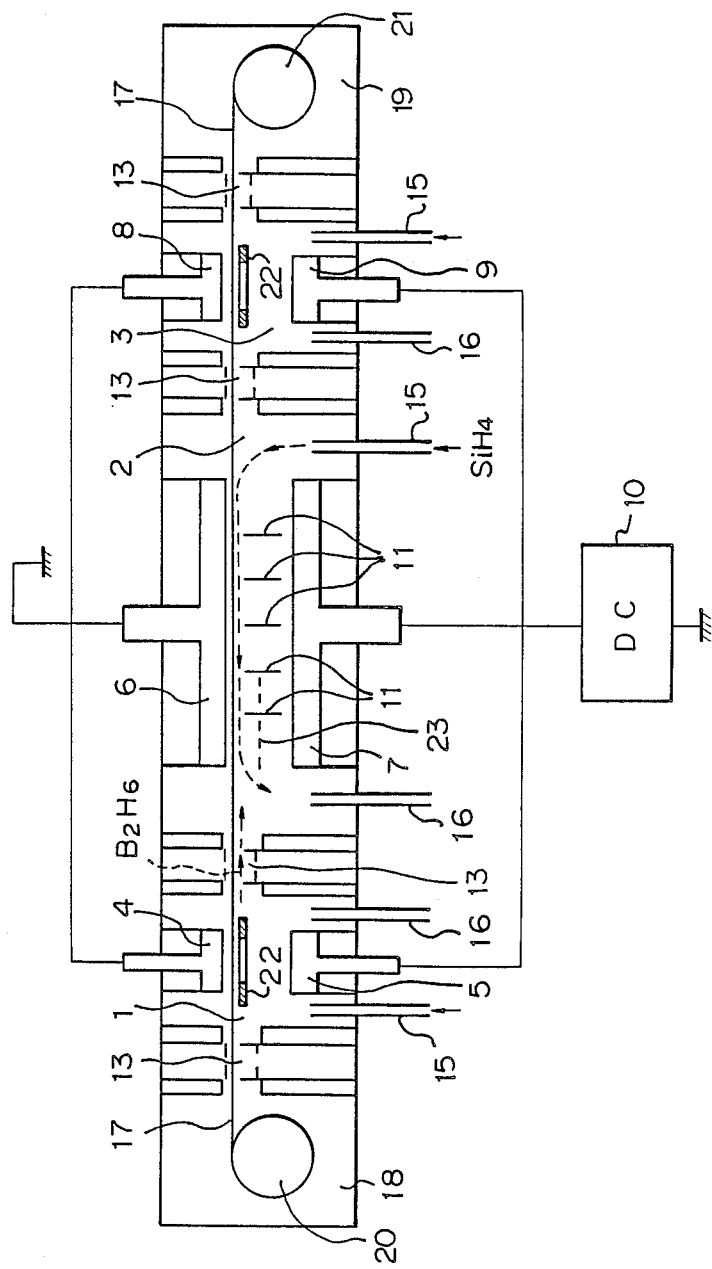
FIG. 1 is a schematic sectional view of a system for manufacturing a solar cell having a p-i-n structure in the roll-to-roll method in accordance with the present invention.

FIG. 1 illustrates a system for continuously manufacturing an amorphous silicon solar cell, as an example of the present invention.

The basic constitution of this apparatus is the same as that of Japanese Unexamined Patent Publication (Kokai) Nos. 58-216475 and 59-34668, the descriptions of which are incorporated herein by reference.

In FIG. 1, reaction chambers 1, 2 and 3 are used for depositing p-type, i-type (intrinsic), and n-type amorphous silicon semiconductor layers. A continuous substrate 17, for example, a flexible polyester resin film which has a laminate of aluminum and stainless steel bilayer as a bottom electrode, is transferred from a supply chamber 18 to a take-up chamber 19 through the first, second, and third reaction chambers 1, 2, and 3, which are respectively connected through buffer chambers 13 for gas isolation. Reference numerals 4 to 9 denote discharge electrodes, and reference numeral 10 denotes a radio frequency power source for supplying a radio frequency power, typically 13, 56 MHz, to the discharge electrodes 4 to 9.

Figure 2:
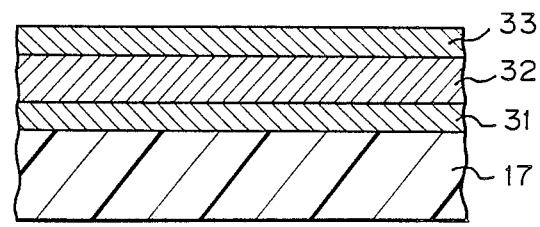
FIG. 2 is a sectional view of the solar cell manufactured by the system of FIG. 1.

In each reaction chamber 1, 2 or 3, silane ($SiH_4$) gas is fed from a gas inlet port 15 and decomposed at a given temperature in a plasma discharge atmosphere to deposit silicon onto the substrate 17. In the first reaction chamber 1, a p-type doping gas, e.g., diborane ($B_2H_6$), is fed with the silane gas to dope a p-type dopant (boron) in the deposited silicon layer. In the third reaction chamber 3, an n-type doping gas, e.g., phosphine ($PH_3$), is fed to form a silicon layer doped with phosphorus, an n-type dopant. Thus, while the substrate 17 is transferred from a supply roll 20 in the supply roll chamber 18 to a take-up roll 21 in the take-up chamber 19, through the reaction chambers 1, 2 and 3, a p-type amorphous silicon layer 31, an i-type amorphous silicon layer 32, and an n-type amorphous silicon layer 33 are successively deposited on the substrate 17, thus forming a p-i-n layered structure of a solar cell (see FIG. 2). When necessary, a mask 22 is placed between the discharge electrodes 5 and 9 and the substrate 17 in the first and third reaction chambers 1 and 3 to control the layer thickness of the p-type and n-type silicon layers in this roll-to-roll method.

As described before, control of a p-type dopant in an i-type silicon layer is preferably to attain a high efficiency of energy conversion of a solar cell, which should be done in the second reaction chamber 2. The problem of plasma damage of the interface between the i-type and underlying p-type silicon layers occurs in the reaction chamber 2. The problem concerning the use of a mask to control the quality and layer thickness of a deposited layer occurs in the first and third reaction chambers 1 and 3, when such a mask is used.

According to the present invention, separators 11 are arranged between the discharge electrodes 6 and 7 in the second reaction chamber 2 to attain a desired profile of a dopant concentration in an i-type silicon layer. Also in the second reaction chamber 2, a grid electrode 23 is preferably arranged between the discharge electrodes 6 and 7 only at a portion near the first reaction chamber 1, so that a high power can be applied to the discharge electrodes 6 and 7 to increase the deposition rate of silicon without causing plasma damage to the interface between the i-type and p-type silicon layers. An electric-field-adjusting means such as a metal wire is provided for the mask 22 in the first and third reaction chambers 1 and 3, to make the electric field profile uniform in an opening of the mask 22.

According to the above features of the present invention, an amorphous silicon solar cell having an improved energy conversion efficiency can be manufactured at a high deposition rate.

Each reaction chamber is now described in more detail.

Figure 3:
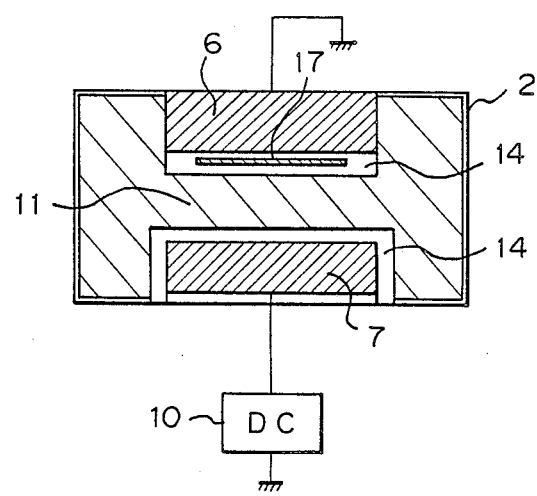
FIG. 3 is a view of a separator provided in the system of FIG. 1.

One example of a second reaction chamber 2 for forming an i-type amorphous silicon semiconductor layer 32 had the following construction. Between opposite discharge electrodes 6 and 7, five separators 11 were arranged perpendicular to the electrodes 6 and 7. FIG. 3 is a sectional view of the reaction chamber 2 and illustrates the shape of the separator 11. The separator 11 separated a space between the discharge electrodes 6 and 7 into a plurality of regions and acted as a barrier for the regions in all of the sections of the reaction chamber 2 except for slight gaps 14 between the separators 11 and the substrate 17 or the discharge electrodes 6 and 7. As a result, a reaction gas fed from an gas inlet port 15 at the downstream end, in the direction of movement of the substrate, of the reaction chamber 2 must have passed through the gaps 14 to reach an outlet port 16 at the opposite upstream end of the reaction chamber 2.

The separators 11 were arranged at a slight distance from the respective discharge electrodes 6 and 7 to form gaps 14 therebetween. The gaps 14 were formed to allow the passage of a reaction gas, to insulate the separators 11 from the power electrode 7, and to allow the passage of the substrate 17 near the electrically grounded electrode 6. The 14 provided a distance of 3 mm between the separators 11 and the respective electrodes 6 and 7. The separators 11 may be made of either an electrically conductive or insulating material but should be a material which does not release an impurity in the plasma. In this example, the separators 11 were made of stainless steel and were electrically grounded to the earth.

The substrate 17 was a 100 μm-thick polyethylene telephthalate film on which a 300 nm-thick aluminum layer and a 5 nm-thick stainless steel layer were laminated. A p-type amorphous silicon layer 31 had been already deposited in the first reaction chamber 1 from a reaction gas of silane mixed with diboran ($B_2H_6$) and the p-type silicon layer 31 had a thickness of 26 to 30 nm on the substrate 17. An n-type amorphous silicon layer 33 to be deposited in the third reaction chamber 3 from a reaction gas of silane mixed with phosphine ($PH_3$) and the n-type silicon layer 33 would have the same thickness as that of the p-type silicon layer 31. An i-type or intrinsic amorphous silicon layer 32 was deposited in the second reaction chamber 2 from silane gas without any doping gas and had a thickness of about 500 nm. As the thickness of the layers 31 to 33 to be deposited were different but the speed of movement of the substrate should be the same in the system in FIG. 1, the power output of the radio frequency power source, the size of the discharge electrodes, the amount of feed gas, the temperatures of the discharge electrodes, and the pressures in the reaction chambers, etc., were adjusted to attain the desired thicknesses of the layers deposited.

The reaction gas of silane was fed to the reaction chamber 2 from the gas inlet port 15 near the third reaction chamber 3 and evacuated from the gas outlet port 16 near the first reaction chamber 1.

Figure 4:
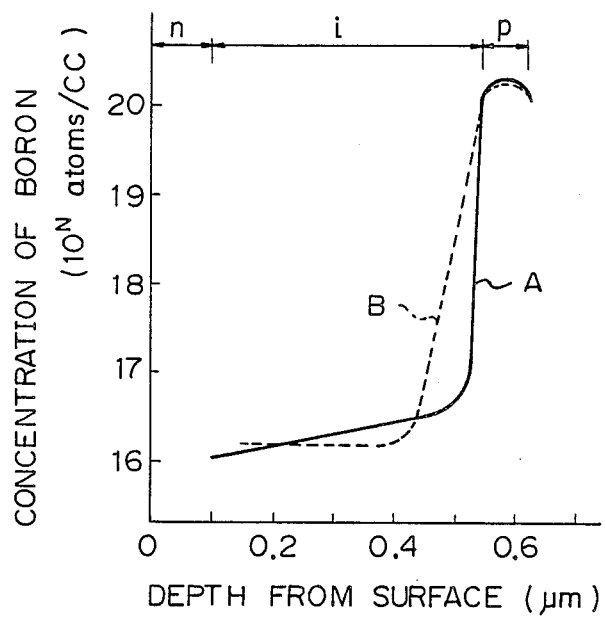
FIG. 4 illustrates a profile of boron in an i-type layer obtained by experiments.

A solar cell having a p-i-n structure was manufactured under the conditions described above, but a grid electrode 23 was not used in this example. The depth profile of boron atom of the thus-obtained solar cell was examined by secondary ion mass spectroscopy (SIMS). The result is shown in FIG. 4 as the solid line A, with the result of a comparative example as the broken line B in which a solar cell having the same layer structure as that of the above example was manufactured under the same conditions except using a conventional system, i.e., without separators. Here, note that it is known that, in the roll-to-roll method as in the system in FIG. 1, slight amounts of $B_2H_6$ and $PH_3$ gases usually penetrate the second reaction chamber 2 from the adjacent reaction chambers 1 and 3 through the buffer chambers 13, and that this is unavoidable. Therefore, a boron concentration profile can be seen in the i-type silicon layer 32 in FIG. 4.

It is seen from FIG. 4 that, in the case of the conventional system without separators, the boron gas from the first reaction chamber 1 was diffused uniformly throughout the reaction chamber 2, resulting in a flat boron atom concentration profile in the direction of the layer thickness of the i-type layer 32. On the other hand, in the case of the example of the present invention using separators, the boron atom concentration profile is abrupt at the interface between the p-type and i-type layers 31 and 32 and has a constant decline in the i-type layer. It is known that an energy conversion efficiency of an amorphous silicon solar cell may be improved by having a gradual doping concentration distribution in an i-type silicon layer. (see, for example, P. Sichanugrist et al "High Performance a-Si:H Solar Cells Prepared from $SiH_4$ at High Deposition Rates", Technical Digest of the International PVSEC-2, Kobe, Japan, P-I-16, pp 187–190, Nov. 13–16/1984). Actually, a solar cell manufactured in accordance with a process of the present invention had improved characteristics as seen in the following table in which characteristics of a comparative solar cell manufactured in a similar process of the prior art, that is, without separators, are also included.

TABLE

| | Value | |
|---|---|---|
| Performance | Invention (with separators) | Comparison (without separators) |
| Open circuit voltage | 0.90 | 0.89 |

TABLE-continued

| Performance | Value | |
|---|---|---|
| | Invention (with separators) | Comparison (without separators) |
| $V_{OC}$ [V] | | |
| Short-circuit current density [mA/cm$^2$] | 14.0 | 12.7 |
| Fill factor | 0.71 | 0.65 |
| Energy conversion efficiency [%] | 9.0 | 7.4 |

The above results demonstrate that, by separating a plasma space in a reaction chamber into regions and preventing gas diffusion to the regions as much as possible, the composition of the reaction gas may be controlled such as having a distribution or profile in a reaction chamber from one end to another end thereof. Thus, according to the present invention, a desired distribution of a reaction gas can be attained.

Figure 5:
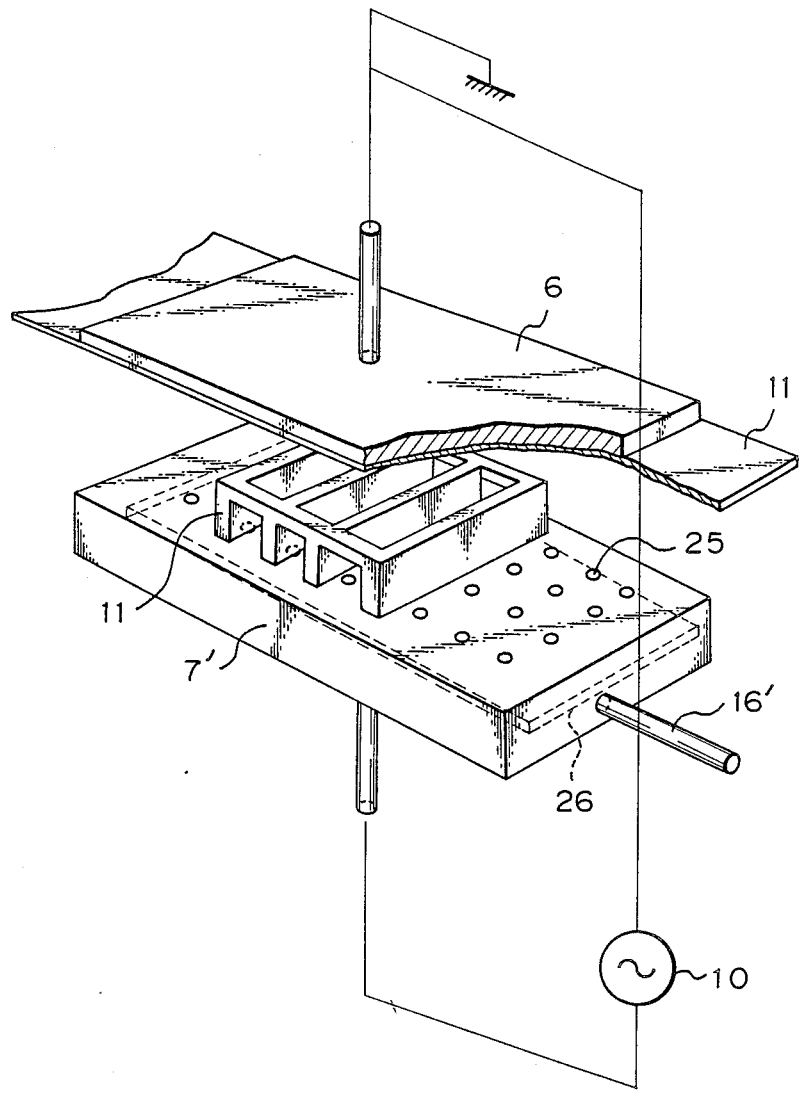
FIG. 5 is a perspective view of an example of a construction of the electrodes and separators.

FIG. 5 illustrates a modification of a reaction chamber 2 in the system shown in FIG. 1. In this embodiment, a reaction gas is fed through a discharge electrode 7' into respective separated regions between the discharge electrodes 6 and 7'. The electrode 7' has many pores 25 at the surface thereof, through which a reaction gas is fed to the respective regions, and contains a gas diffusing plate 26 by which the reaction gas fed from a gas inlet port 16' is distributed throughout the electrode 7'.

Figure 6:
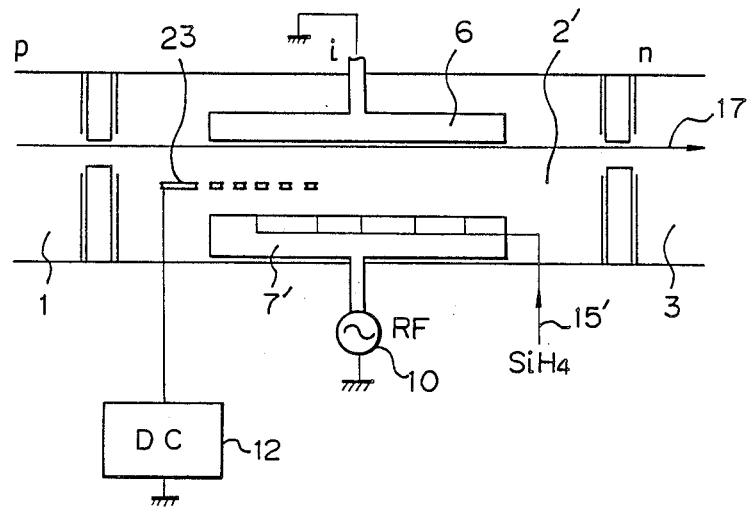
FIG. 6 is a sectional view of a reactor having a grid electrode between discharge electrodes.

Next, the effects of a grid electrode in a reactor were examined as shown in FIG. 6, which shows a part of the reaction chamber 2' of the system of FIG. 1. In this reaction chamber 2', however, the separators 11 were not used and a discharge electrode 7' as shown in FIG. 5 was used in place of the discharge electrode 7 in FIG. 1. Further, a grid electrode 23 was arranged between the discharge electrodes 6 and 7'. The grid electrode 23 was disposed along a substrate 17 and covered the full width of the substrate 17 and about one third of the length of the discharge electrodes 6 and 7' in the direction of movement of a substrate 17 from the end of the electrodes 6 and 7' where the substrate 17 was introduced. The grid electrode 23 was capable of being supplied with a bias voltage (e.g., +200 V to −200 V) by a DC power source 12. The grid electrode 23 was made of stainless steel and was a mesh having a mesh size of 200.

The substrate 17 was the same as that used in the former example. The structure of the layers of a solar cell was also the same as in the former example. But the discharge power, the speed of movements of a substrate, and the pressure of the reaction gases, etc., were controlled to obtain the same structure of the layers. The grid electrode 23 was spaced from the substrate 17 by a distance of 25 mm and the distance between the discharge electrodes 6 and 7' was 50 mm.

Figure 7:
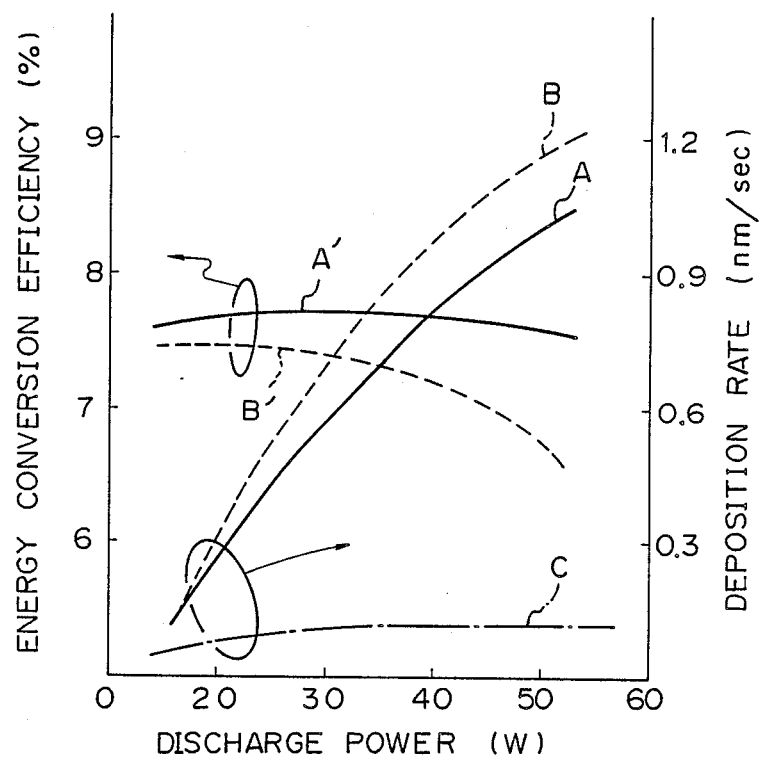
FIG. 7 illustrates the relationships of the deposition rate and energy conversion efficiency to the discharge power.

In this system, solar cells were manufactured with a bias of −20 V applied to the grid electrode 23 and various radio frequency powers applied to the discharge electrodes 6 and 7'. The deposition rates in this experiment is shown as the solid line A in FIG. 7. Of course, with the increase of the discharge power, the deposition rate also increased, as seen in FIG. 7. The characteristics of the resultant solar cells, i.e., energy conversion efficiencies of the solar cells, were then examined in relation to the discharge power. The results thereof are shown also in FIG. 7 as the solid line A'. In comparison, very similar solar cells were manufactured as above except that the grid electrode 23 was removed from the reaction chamber 2'. The energy conversion efficients of the resultant solar cells were also examined and are shown in FIG. 7 as the broken line B', together with the broken line B for the deposition rate. Moreover, very similar solar cells were again manufactured with a grid electrode covering the entire width and length of the discharge electrodes 6 and 7' in the reaction chamber 2'. The results thereof are shown in FIG. 7 as the dotted line C.

As seen in FIG. 7, in an example of the present invention, i.e., using a grid electrode, the energy conversion efficiency of the solar cell was not decreased although the discharge power or the deposition rate was increased. In contrast, in a conventional system, i.e., without a grid electrode, the energy conversion efficiency of the solar cell was decreased with an increase of the discharge power or the deposition rate. In case of the grid electrode covering the entire width and length of the discharge electrode, the deposition rate was not increased even if the discharge power was increased.

Figure 8:
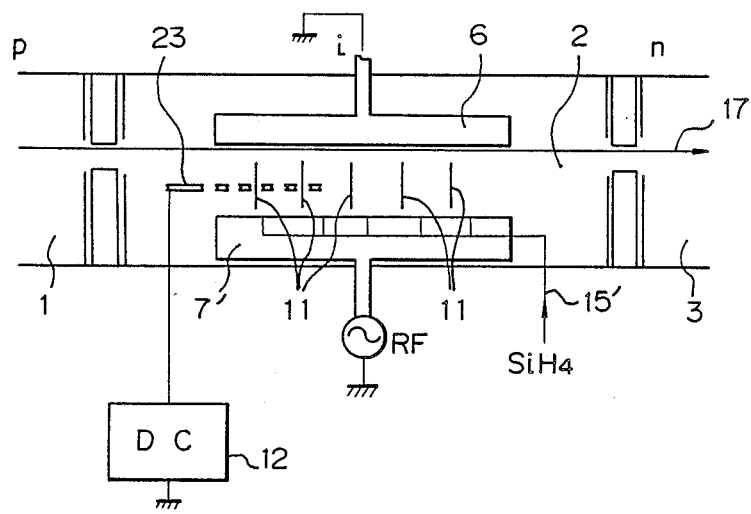
FIGS. 8 and 9 are sectional views of reactors provided with separators and a grid electrode.
Figure 9:
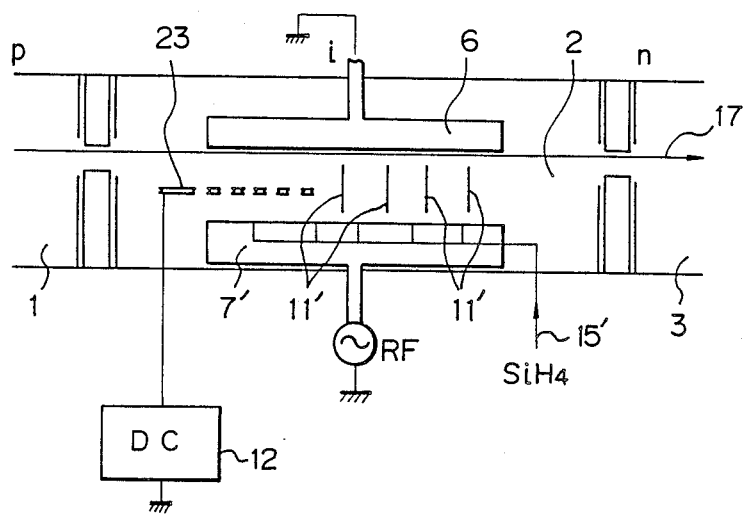

FIGS. 8 and 9 illustrate examples of a reactor for depositing a semiconductor layer, in which a combination of separators and a grid electrode described above is used. In FIG. 8, separators 11 are arranged between the discharge electrodes 6 and 7' as in FIG. 1, i.e., throughout the space between the discharge electrodes 6 and 7' and a grid electrode 23 is arranged as in FIG. 6, i.e., between the discharge electrodes 6 and 7' only at a portion (one third) of the discharge electrodes 6 and 7' near the entrance of a substrate 17. In this example, the grid electrode 23 overlaps some of the separators and generally should be electrically insulated from the separators, usually by spacing the grid electrode 23 from the separators 11. In FIG. 9, a grid electrode 23 is arranged as in FIG. 6 and separators 11' are arranged only at the remaining portion of the space between the discharge electrodes, i.e., following the grid electrode 23 in the direction of movement of a substrate.

Now, regarding the first or third reaction chamber 1 or 3 of the system of FIG. 1, the effect of an electric-field-adjusting means provided with a mask opening was confirmed by the following example.

Figure 10:
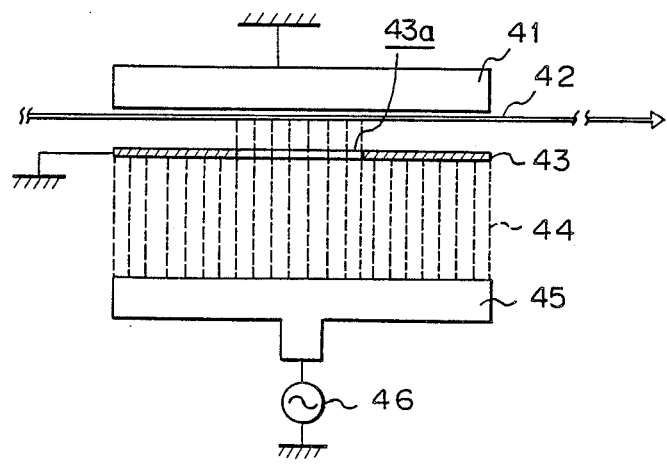
FIG. 10 is a schematic view of a construction of discharge electrodes with a mask having an opening.

FIG. 10 shows an inner construction of a reactor used in the experiments, in which reference numeral 41 denotes an electrode which is electrically grounded, reference numeral 42 denotes a substrate of a polymer film which is continuously moved in the direction of the arrow, reference numeral 43 denotes a mask having an opening 43a (50 mm long and 250 mm wide) for controlling the thickness of a deposited layer, reference numeral 44 denotes a plasma, reference numeral 45 denotes a high frequency discharge electrode, and reference numeral 46 denotes a radio frequency power source for the electrodes 41 and 45, the frequency of the radio frequency discharge power being 13.56 MHz.

Figure 11:
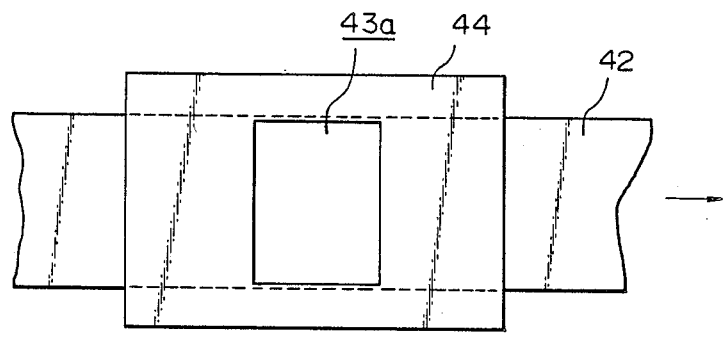
FIG. 11 illustrates a mask having an opening without an electric-field-adjusting means.

In this reactor, with a conventional mask as shown in FIG. 11, i.e., without an electric-field-adjusting means, an n-type amorphous silicon semiconductor layer was deposited from a reaction gas of a mixture of hydrogen, silane and phosphine. The pressure in the reaction chamber was 1 Torr, the temperature of the substrate 42 was 160° C., the discharge power applied was 0.05 W/cm$^2$, and the substrate 42 was stopped for 30 minutes. It was confirmed that, although a portion of the deposited silicon semiconductor layer near the edge of the opening 43a was microcrystalline having a conductivity of about 5S·cm$^{-1}$, the central portion of the deposited silicon semiconductor layer had a considerably lower conductivity of $9 \times 10^{-4}$ S·cm$^{-1}$, which indicated that the central portion of the deposited layer was completely amorphous, not microcrystallized.

Figure 12:
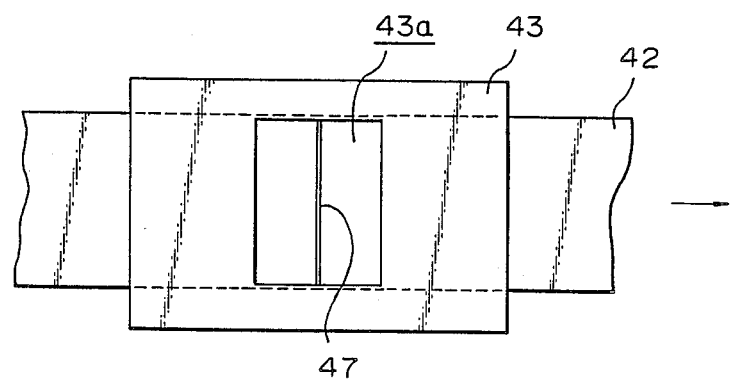
FIG. 12 illustrates a mask having an opening and provided with an electric-field-adjusting means.

Next, a mask provided with a wire at the center of the opening 43a of the mask 43, the wire crossing the opening 43a as shown in FIG. 12, was used as an electric-field-adjusting means and an n-type silicon semiconductor layer was deposited under the same condition as above except for the applied power. The applied discharge power varied from 0.01 to 0.04 W/cm$^2$. The wire was stainless steel and had a diameter of 1 mm.

Figure 13:
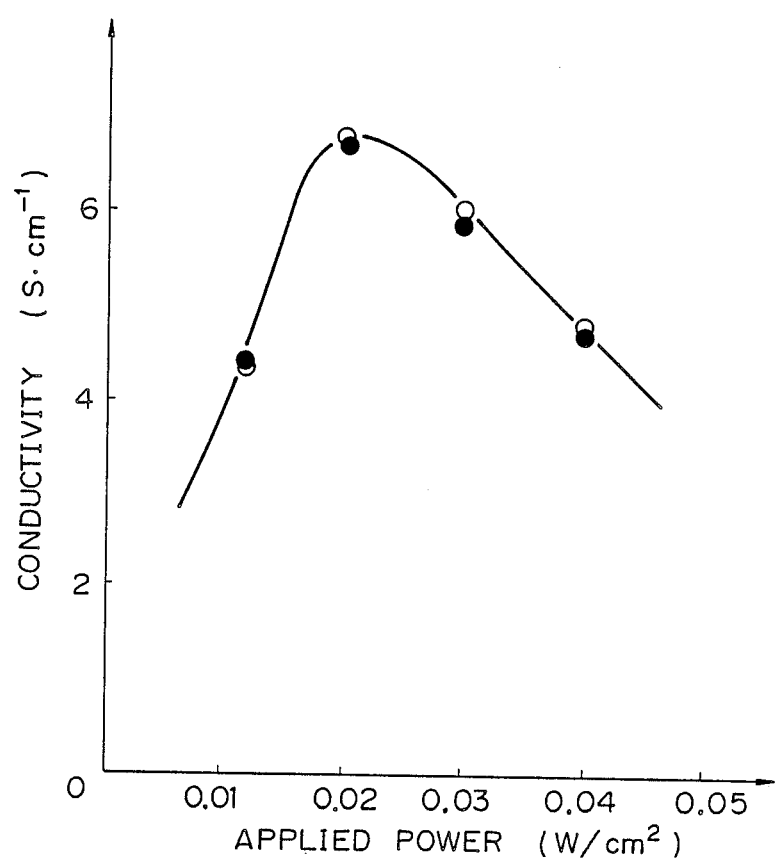
FIG. 13 shows a relationship of the conductivity of a deposited layer obtained in an experiment to the applied discharge power.

FIG. 13 shows the conductivity of the resultant deposited silicon semiconductor layer at the center portion of the opening 43a. In FIG. 13, white circles indicates a value measured under a light and black circles indicate a value measured in the dark. From these results, it was confirmed that even the central portion of the deposited silicon semiconductor layer was completely microcrystallized when a metal wire is provided at the mask opening. It was also confirmed that the deposited silicon semiconductor layer was a uniform microcrystalline film throughout the mask opening. As a result, the characteristics of the silicon semiconductor layer were desirably improved in comparison with those obtained in a conventional reactor.

Furthermore, according to the present invention, i.e., using an electric-field-adjusting means, it was also seen that a deposited layer can be microcrystallized by a low power density, such as about 0.02 W/cm$^2$, one half of a conventionally used power density. Note that distribution of the thickness obtained by this method were very uniform as compared with a conventional method, and thus no problem arose.

In general mask with an opening is used for control of the quality of layer thickness of the layer. The above experiment demonstrated that the electric field in an opening of a mask used between a substrate and one of the discharge electrodes can be made uniform by providing an electric-field-adjusting means at the mask opening, which allows a uniform deposited layer to be obtained. This is obviously advantageous even if a deposited layer is amorphous and not microcrystalline.

Returning to FIG. 1, in accordance with the system of the present invention, which includes masks 22 with an electric-field-adjusting means (such as the means 47 in FIG. 12) in the first and third reaction chambers 1 and 3; and separators 11 and a grid electrode 23 in the second reaction chamber, a solar cell having a p-i-n structure can be continuously manufactured on a flexible polymer film with an increased deposition rate without deterioration of the characteristics of a solar cell, but with an improved characteristic such as an energy conversion efficiency of a solar cell. The present invention apparently may be also applied to a solar cell having an n-i-p structure, a p-i-n/p-i-n tandem structure or other structures, as well as any other multilayer semiconductor device. Note that the present invention is advantageous when a reactor is provided with any of separators and a grid electrode and, when the reactor includes a mask having an opening and an electric-field-adjusting means.

We claim:

1. A reactor for depositing a layer on a moving substrate, said reactor comprising:

a reaction chamber having opposite ends;

opposite electrodes for electric discharge arranged in the reaction chamber, means for moving said substrate between the opposite electrodes from one end to the other end of the reaction chamber;

first means for feeding a reaction gas into the reaction chamber;

means for separating at least the space between the moved substrate and one of the opposite electrodes into a plurality of regions and substantially preventing a diffusion of a gas between the separated regions; and a power source for supplying power between the opposite electrodes to excite the reaction gas to a plasma state;

whereby a layer having a modified depth composition profile may be deposited on the substrate.

2. A reactor according to claim 1, wherein said separating means acts as a barrier for all cross-sections of the reaction chamber except for a gap between said separating means and the moving substrate.

3. A reactor according to claim 1, wherein said first gas feeding means feeds the reaction gas at one of said opposite ends of the reaction chamber and the gas in the reaction chamber is evacuated near the other end of said opposite ends of the reaction chamber.

4. A reactor, according to claim 3, further comprising a second means for feeding gas into the reaction chamber at said other end of said opposite ends of the reaction chamber.

5. A reactor according to claim 1, wherein said one of said opposite electrode acts as said first gas feeding means and feeds the reaction gas into each region separated by said separating means.

6. A reactor, according to claim 5, further comprising a second means for feeding a gas into the reaction chamber at said other end of said opposite ends of the reaction chamber.

7. A reactor according to claim 6, wherein said second means is for feeding a gas feeds a doping gas.

8. A reactor according to claim 1, wherein said substrate is a flexible strip and is transferred from a supply roll to a take-up roll through said reaction chamber, during which transfer the layer is deposited on the substrate.

9. A reactor according to claim 1, for depositing an amorphous silicon layer.

10. A reactor according to claim 1, further comprising: a grid electrode disposed between one of the opposite electrodes and the moving substrate at a given length from an end of the opposite electrodes near said one end of the reaction chamber toward another end of the opposite electrodes near said other end of the reaction chamber, said grid electrode having a width larger than the width of the moving substrate; whereby a layer having a modified depth composition profile is deposited on the substrate and damage to the interface of the substrate and deposited layer by plasma bombardment is minimized.

11. A reactor according to claim 10, wherein said layer to be deposited is a semiconductor layer and said substrate already has on the top thereof another semiconductor layer of a different semiconductor from said semiconductor to be deposited.

12. A reactor according to claim 11, wherein said semiconductor layer to be deposited is an i-type silicon semiconductor and said another semiconductor layer is selected from the group consisting of p-type and n-type silicon semiconductors.

13. A reactor according to claim 10, wherein said grid electrode is a porous metal plate.

14. A reactor according to claim 10, wherein said grid electrode is a metal mesh screen.

15. A reactor according to claim 10, wherein said grid electrode has a length of less than half of the length of the opposite electrodes.

16. A reactor for depositing a layer on a moving-substrate, comprising:
   a reaction chamber having opposite ends;
   opposite electrodes for electric discharge arranged in the reaction chamber,
   means for moving said substrate between the opposite electrodes from one end to the other end of the reaction chamber;
   means for feeding a reaction gas into the reaction chamber;
   a power source for supplying power between the opposite electrodes to excite the reaction gas to a plasma state;
   a mask means having an opening, disposed between one of said opposite electrodes and the moving substrate, for limiting an area where said layer is deposited on the moved substrate, said mask means being provided with means for adjusting an electric field in the opening of the mask,
   whereby a layer having a modified distribution of the quantity thereof is deposited on the substrate.

17. A reactor according to claim 16, wherein said electric field adjusting means is a metal wire extending transverse at the center of the opening of said mask means in relation to the direction of the movement of the substrate, so that the electric field in the opening of the mask can be made uniform.

18. A reactor according to claim 16, wherein said substrate is a flexible strip transferred from a supply roll to a take-up roll through said reaction chamber.

19. A reactor according to claim 16, wherein said reactor is for uniformly depositing a microcrystalline silicon semiconductor layer on the substrate.

20. A reactor according to claim 16, for manufacturing an amorphous silicon solar cell.

21. A reactor for depositing a layer on a moving substrate, said apparatus comprising:
   a reaction chamber having opposite ends;
   opposite electrodes for electric discharge arranged in the reaction chamber means for moving said substrate between the opposite electrodes from one end to the other end of the reaction chamber;
   means for feeding a reaction gas into the reaction chamber;
   a power source for supplying power between the opposite electrodes to excite the reaction gas to a plasma state, and
   a grid electrode disposed between one of the opposite electrodes and the moving substrate along a portion of the length from an end of the opposite electrodes near said one end of the reaction chamber toward another end of the opposite electrodes near said other end of the reaction chamber, said grid electrode having a width larger than the width of the moving substrate;
   whereby damage to the interface of the substrate and the deposited layer by plasma bombardment is minimized.

22. A reactor according to claim 21, wherein said layer to be deposited is a semiconductor layer and said substrate already has on the top thereof another semiconductor layer of a different semiconductor from said semiconductor to be deposited.

23. A reactor according to claim 22, wherein said semiconductor layer to be deposited is an i-type silicon semiconductor and said another semiconductor layer is selected from the group consisting of p-type and n-type silicon semiconductors.

24. A reactor according to claim 21, wherein said grid electrode is a porous metal plate.

25. A reactor according to claim 21, wherein said grid electrode is a metal mesh screen.

26. A reactor according to claim 21, wherein said grid electrode has a length of less than half of the length of the opposite electrodes.

27. A system for manufacturing a semiconductor device by depositing a first layer on a substrate in a first reactor, and depositing a second layer on the first layer on the substrate in a second reactor and then depositing a third layer on the second layer above the substrate in a third reactor, the substrate being transferred from the first to the second to the third reactors,
   (A) said first reactor comprising:
      (i) a first reaction chamber having first and second ends;
      (ii) first and second electrodes for electrical discharge arranged in the first reaction chamber, the substrate being moved between the first and second electrodes from the first to second ends of the first reaction chamber;
      (iii) a first mask means having an opening, disposed between the second electrode and the moving substrate, for limiting an area whereat the first layer is deposited on the moving substrate;
      (iv) first means for feeding a first reaction gas into the first reaction chamber; and
      (v) a first power source for supplying a power between the first and second electrodes to excite the first reaction gas to a plasma state;
   (B) said second reactor comprising:
      (i) a second reaction chamber having third and fourth ends, the third end of the second reaction chamber being connected with the second end of the first reaction chamber;
      (ii) third and fourth electrodes for electric discharge arranged in the second reaction chamber, the substrate having the first layer thereon being moved between the third and fourth electrodes from the third to fourth ends of the second reaction chamber;
      (iii) means for feeding a second reaction gas into the second reaction chamber;
      (iv) means for separating at least the space between the moved substrate and the fourth electrode into a plurality of regions and substantially preventing a diffusion of a gas between the separated regions; and
      (v) a second power source for supplying a power between the third and fourth electrodes to excite the second reaction gas to a plasma state; and
   (C) a third reactor comprising:
      (i) a third reaction chamber having fifth sixth end, the fifth end of the third reaction chamber being connected to the fourth end of the second reaction chamber;
      (ii) fifth and sixth electrodes for electric discharge arranged in the third reaction chamber, the substrate having the first and second layers thereon being moved between the fifth and sixth electrodes from the fifth to sixth ends of the third reaction chamber;

(iii) a second mask means having an opening, disposed between the sixth electrode and the moving substrate, for limiting an area whereat the third layer is deposited on the moving substrate, at least one of said first and second mask means being provided with means for adjusting an electric field in the opening of the mask;

(iv) third means for feeding a third reaction gas into the third reaction chamber; and (v) a third power source for supplying a power between the fifth and sixth electrodes to excite the third reaction gas to a plasma state.

28. A system according to claim 27, said second reactor further comprising (vi) a grid electrode disposed between the fourth electrode and the moved substrate along a given length from an end of the third and fourth electrodes near the third end of the second reaction chamber toward another end of the third and fourth electrodes near the fourth end of the second reaction chamber, the grid electrode having a width larger than the width of the moved substrate.

29. A system according to claim 27, wherein said electric field adjusting means is a metal wire extending transverse at the center of the opening of said mask means in relation to the direction of the movement of the substrate.

30. A system according to claim 27, for manufacturing a silicon semiconductor solar cell having a structure selected from the group consisting of p-i-n and n-i-p structures.

31. A system according to claim 27, wherein at least one of said first and third silicon semiconductor layers is microcrystalline and the remaining layers are non-crystalline.

* * * * *

UNITED STATES PATENT AND TRADEMARK OFFICE
CERTIFICATE OF CORRECTION

PATENT NO. : 4,920,917

DATED : May 1, 1990

INVENTOR(S) : Nakatani, et al.

It is certified that error appears in the above-identified patent and that said Letters Patent is hereby corrected as shown below:

Column 1, line 56, after "chambers" insert --chambers connected in a series--;

Column 1, line 67, delete "such a" and insert --the--;

Column 2, line 7, delete "each";

Column 2, line 14, change "neighbor" to --neighboring--;

Column 2, line 42, delete "the" and insert --increasing--;

Column 6, line 11 change "not so as" to --so as not--;

Column 6, line 24, delete "adjustification" and insert --adjustment--;

Column 9, line 54, change "the 14" to --the gaps 14--;

Column 11, line 61, delete "is" and insert --are--;

UNITED STATES PATENT AND TRADEMARK OFFICE
CERTIFICATE OF CORRECTION

PATENT NO. : 4,920,917
DATED : May 1, 1990
INVENTOR(S) : NAKATANI, et al.

It is certified that error appears in the above-identified patent and that said Letters Patent is hereby corrected as shown below:

Column 14, line 27, before "gas" insert --a--;

Column 14, line 49, delete "at" and insert --along--;

Column 16, line 36, delete "a";

Column 16, line 57, delete "a";

Column 16, line 61, before "sixth" insert --and--;

Column 16, line 61, change "end" to --ends--;

Column 17, line 4, change "moving" to --moved--;

Column 17, line 6, change "moving" to --moved--;

Signed and Sealed this

Fourth Day of August, 1992

*Attest:*

DOUGLAS B. COMER

*Attesting Officer*     *Acting Commissioner of Patents and Trademarks*